United States Patent [19]
Nardin et al.

[11] 3,753,142
[45] Aug. 14, 1973

[54] SIGNAL GENERATORS EMPLOYING DIGITAL PHASE LOCKED LOOPS AND COMPENSATING CIRCUITS

[75] Inventors: Roy Nardin, Middle Village; Frank J. Sposato, Huntington, both of N.Y.

[73] Assignee: Logimetrics Inc., Greenvale, N.Y.

[22] Filed: June 12, 1972

[21] Appl. No.: 262,248

[52] U.S. Cl. .................... 331/1 A, 331/16, 331/17, 331/27
[51] Int. Cl. .................... H03b 3/04
[58] Field of Search .................... 331/1 A, 17, 27, 331/16

[56] References Cited

UNITED STATES PATENTS

| | | | |
|---|---|---|---|
| 3,364,437 | 1/1968 | Loposer et al. | 331/1 A |
| 3,488,605 | 1/1970 | Schwartz | 331/1 A |
| 3,611,175 | 10/1971 | Boelke | 331/1 A |
| 3,624,521 | 11/1971 | Dellicicchi | 331/17 |
| 3,689,903 | 9/1972 | Agrawala | 331/17 |

*Primary Examiner*—John Kominski
*Attorney*—Arthur L. Plevy

[57] ABSTRACT

There is described a signal generator capable of being tuned over a relatively high frequency range. The generator includes a VCO which is controlled in frequency by a phase locked loop. The loop operates to compare a reference frequency from an accurate crystal source with the divided oscillator frequency. The division is afforded by a first frequency counter which controls a programmable divider to cause the same to divide by the correct integer independent of the oscillator tuning. The phase locked loop includes a phase detector responsive to digital waveforms to provide a dual polarity error control signal by combining outputs of the phase detector in a differential operational amplifier. The operational amplifier is further controlled to cancel an error offset voltage so that the final output signal is free from spurious modulation products.

8 Claims, 5 Drawing Figures

SIGNAL GENERATORS EMPLOYING DIGITAL PHASE LOCKED LOOPS AND COMPENSATING CIRCUITS

BACKGROUND OF INVENTION

This invention relates in general to a signal generator, and more particularly to a signal generator of the type employing a phase locked loop.

The phase locked loop has been widely utilized as a basic means of achieving frequency stability. There are virtually numerous applications for the phase locked loop in various apparatus such as signal generators, radio and television receivers and so on. Essentially, the phase locked loop serves to control the phase or frequency of an oscillator by comparing the output of the oscillator with a predetermined stable reference frequency. A phase detector incorporated in such a loop produces an error voltage proportional to the deviation in phase or frequency between the reference signal and the oscillator signal. The error voltage is then utilized to vary the frequency or phase of the oscillator so that the oscillator is locked to the frequency or phase of the reference signal source. In this manner the oscillator may achieve the frequency or phase stability associated with the reference source. The concept of the phase locked loop has been so successful that there are a large number of instruments which use this technique for obtaining frequency synthesis. In these instruments, a plurality of frequency signals are provided over a large, predetermined band of frequencies, each one having the stability of the reference oscillator. The reference oscillator, of course, is usually a crystal controlled device which devices have inherently good stability and are relatively accurate in both frequency and phase. The function of the phase locked loop therefore being to ascertain that the phase or frequency of the oscillator to be controlled is determined by the accurate phase and frequency of the crystal reference source.

Due to the nature of such instruments as signal generators and radio receivers the phase locked loop must operate over a relatively wide band of frequencies.

For example, in the case of a radio receiver such a unit may be capable of being tuned over a wide range of frequencies to accommodate a wide range of transmitted signals. In a super-heterodyne receiver, the local oscillator thereof may be controlled by means of the phase locked loop. The incoming signal and the local oscillator signal are combined in a mixer circuit to provide at an output a fixed IF frequency. In this manner, the phase locked loop may operate to compare the fixed IF frequency with a frequency equal to the same and derived from a reference crystal oscillator source. This reference crystal oscillator source is selected to have an output frequency equal to the desired IF and therefore is there is a deviation in frequency or phase between the actual IF and the crystal reference signal an error voltage provided by a phase detector will cause the local oscillator of the receiver to vary so that the deviation approaches zero. Due to the magnitude of the operating frequencies accommodated by signal generators and radio receivers it has been desirable to incorporate within the phase locked loop a frequency divider circuit. The function of the frequency divider circuit is to divide down the oscillator frequency to a convenient lower frequency and this frequency is the one to be compared with the crystal reference source.

In such arrangements as one can readily ascertain, the frequency divider has to vary its division ratio according to the tuning of the oscillator. For example, assume that the reference frequency of the crystal oscillator is 100KHz. As the local oscillator is tuned, the output of the frequency divider should be 100KHz in order to compare the divided oscillator frequency with the crystal reference. Now assume that the local oscillator varied in frequency from 500KHz to 1,000KHz, this means that the divider for the first frequency would have to provide a division by 5 and for the second frequency would have to provide a division by 10. Therefore, such phase locked loops employ variable divider circuits whose division factor was changed according to frequency. For an example of such prior art devices, reference is made to U.S. Pat. No. 3,217,267 entitled "Frequency Synthesis Using Fractional Division By Digital Techniques Within A Phased Locked Loop" by T. L. Loposer issued on Nov. 9, 1965 and assigned to Ling-Temco-Vought, Inc. The above noted patent shows a variable frequency oscillator controlled by a phase discriminator wherein the frequency of the oscillator is divided by means of a variable divider.

A common type of divider incorporated in such equipment as also shown in the above noted patent is a digital divider. Basically, such dividers incorporate a plurality of cascaded multivibrators arranged in a counter or shift register configuration. In the case of a bistable multivibrator as is well known, the circuit can perform a frequency division by 2. Cascaded counting arrangements of such multivibrators can be programmed to perform division by any selected factor according to a predetermined digital code which operates to set or reset such multivibrators, to thereby determine the frequency division factor. Since such dividers are digital, as compared to analog devices, the waveforms provided are typical digital waveforms and take the appearance of square waves or pulse trains. In this manner in order to utilize conventional phase detectors such as ratio detectors or discriminator circuits as Foster Seely discriminators, one had to utilize filtering techniques in order to operate the same with relatively sinusoidal waveforms. However, there also are a great many techniques which can compare the phase or frequency of such typical digital waveforms and produce error correcting voltages therefrom.

In any event in the case of a signal generator using phase locked techniques, it is desirable to provide for a programmable divider which is easy to implement both in frequency division and in the ability to vary the division factor according to frequency. It is further desirable to provide a simple digital phase detector which can operate directly upon digital waveforms to provide therefrom an analog error control voltage which voltage can be used to vary the frequency or phase of a controlled oscillator by means of a phase comparison with a reference frequency source. Due to the fact that signal generators are utilized to perform high accuracy measurements, it is of paramount importance that the frequency stability of the oscillator be accurately controlled and that the phase stability also be accurately controlled. Since a signal generator is an apparatus which is used to make measurements upon other apparatus or systems, it is important that any errors in frequency or phase in the output thereof be minimized.

It is of further importance that there be no substantial undesirable frequency or phase modulation on the output waveform. These factors would cause errors in measurement and therefore be undesirable.

It is therefore an object of the present invention to provide an improved signal generator apparatus utilizing a phase locked loop incorporating a variable digital divider including a novel and accurate phase detector circuit suitable for varying the frequency of an oscillator according to a detected error.

DESCRIPTION OF PREFERRED EMBODIMENT

A signal generator employs a variable oscillator capable of being tuned over a relatively wide band of frequencies, the oscillator is the type whose frequency may be electronically controlled by application to a control input thereof of a voltage signal, the generator includes a first frequency counter coupled to said oscillator and operative to store a count therein representative of the frequency of the oscillator and a second programmable counter having a plurality of inputs for the programmable counter to cause the same to always divide the frequency of the oscillator by an integer to cause the output of the counter to be relatively equal in frequency to a standard, accurate reference signal. A digital phase detector operates to compare the divided signal with the reference signal to provide an error signal when the same are not in frequency or phase sychronism. The phase detector provides two output error signals dependent on which of the two frequencies is higher, these error signals are combined in an operational amplifier whose inherent input offset is further cancelled by a synchronous detector arrangement to prevent spurious modulation components from appearing at the output of the variable oscillator.

DETAILED DESCRIPTION OF FIGURES

Figure 1:
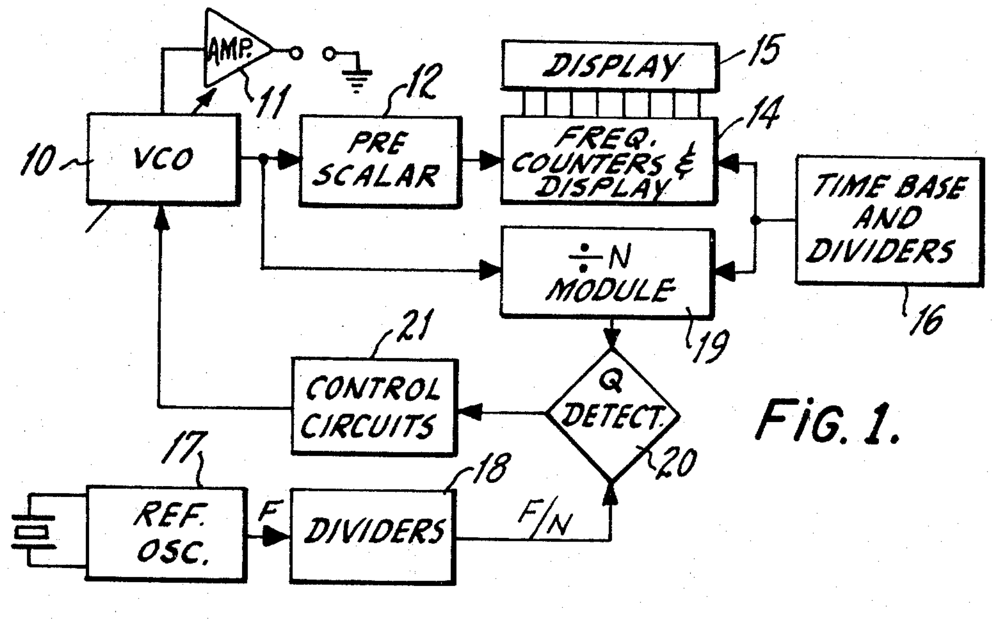
FIG. 1 is a block diagram of a signal generator incorporating a phase locked loop according to this invention.

Referring to FIG. 1 there is shown a variable frequency oscillator 10, which further includes a variable reactance control device to enable frequency control by means of an error voltage. The oscillator 10 is referred to as a VCO to indicate a voltage controlled oscillator.

Such oscillators as 10 may be band switched to enable tuning over a wide range of frequencies or be otherwise controlled by means of mixing, dividing and other frequency generating techniques to afford accommodating of a wide frequency range. As indicated, the oscillator 10 may include a variable reactance device for frequency control, such as a varactor diode and so on. Such devices exhibit a variation of capacitance or reactance according to an applied voltage or current.

The output of the oscillator 10 is available for use as a test signal via isolation amplifier 11. In any event, the manner in which the output frequency is derived is not of particular concern as the same may be divided or multiplied in frequency prior to use as a test signal. Such techniques for performing frequency division and multiplication are well known in the art.

The output signal from the VCO 10 is further applied to a pre-scaler module 12. The prescaler 12 functions to divide the frequency of the VCO 10 by a desired integer before application to the counter module 14 associated with a display 15. In this particular signal generator the frequency of the VCO is indicated directly on the display 15 therefore enabling the operator to set the generator frequency without resorting to complicated dial readings and so on. Examples of ways of implementing such counting arrangements for display means as well as techniques for selecting the time base and so on to assure accurate frequency indication is shown in U. S. Pat. No. 3,509,484 entitled "Digital Frequency Counting And Display Apparatus For Tunable Wide Bank Signal Generators" issued on Apr. 28, 1970 to Philip Basse and assigned to the same assignee herein.

The timing for the display is provided by a time base generator and divider module 16. The time base generator may be a crystal controlled oscillator capable of providing an accurate timing waveshape, which can further be divided down by means of a cascaded arrangement of binary multivibrators to provide gating signals or timing references for the frequency counters and display module 14.

The signal generator further includes a phase locked loop to accurately determine the frequency of the VCO 10.

The phase locked loop includes a stable reference frequency source 17, which is a crystal controlled oscillator. The output of the oscillator 17 is divided down by a divider assembly 18, to provide a reference frequency to be used as a standard of comparison for the phase locked loop. The dividers 18 may be conventional counting chains of cascaded bistable multivibrators to provide at an output thereof the reference frequency F divided by N. This frequency (F/N) may be for example 100KHz, while the frequency F may be 1MHz or higher, thus specifying a division by dividers 18 of 10 or more. It is of course understood that any other arrangement can be provided to produce the reference for the phase locked loop, as other frequencies and division factors can be selected accordingly.

The phase locked loop is used to control the frequency of tee VCO 10 which frequency is monitored and compared with the standard frequency available via dividers 18.

The frequency from VCO 10 is divided down by the DIVIDE BY N (÷ N) Module 19, such that the output from the module 19 is in close proximity to the divided reference frequency F/N. The divide by N module 19 has an output coupled to an input of the phase detector 20. Another input to phase detector 20 is supplied via the standard frequency divider 18. The phase detector 20 provides an error voltage proportional to the difference in frequency and/or phase between the output of the ÷ N, 19 and the F/N signal from divider 18.

The error voltage is applied to the VCO 10 via the control circuits 21, to vary the frequency of oscillator 10 in a direction such that the frequency output of module 19 is substantially equal to the frequency output of divider 18. This then assures that the frequency of VCO 10 is locked or synchronized with the frequency of the reference oscillator 17 within predetermined limits.

It is also noted that since the VCO is capable of being varied over a wide range of frequencies that the ÷ N module 19 has to vary its division factor according to the coarse tuning of VCO 10. This, as will be explained, is done automatically. The circuitry included in module 19 therefore assures that the signal applied to the phase detector 20 via the module 19 is always within the vicinity of the signal obtained from the reference oscillator 17 and divider 18.

The function of the control circuits 21, as will be described in detail subsequently, is to monitor the error signal from a phase detector 20 and to further provide temperature compensation and ripple nulling.

Figure 2:
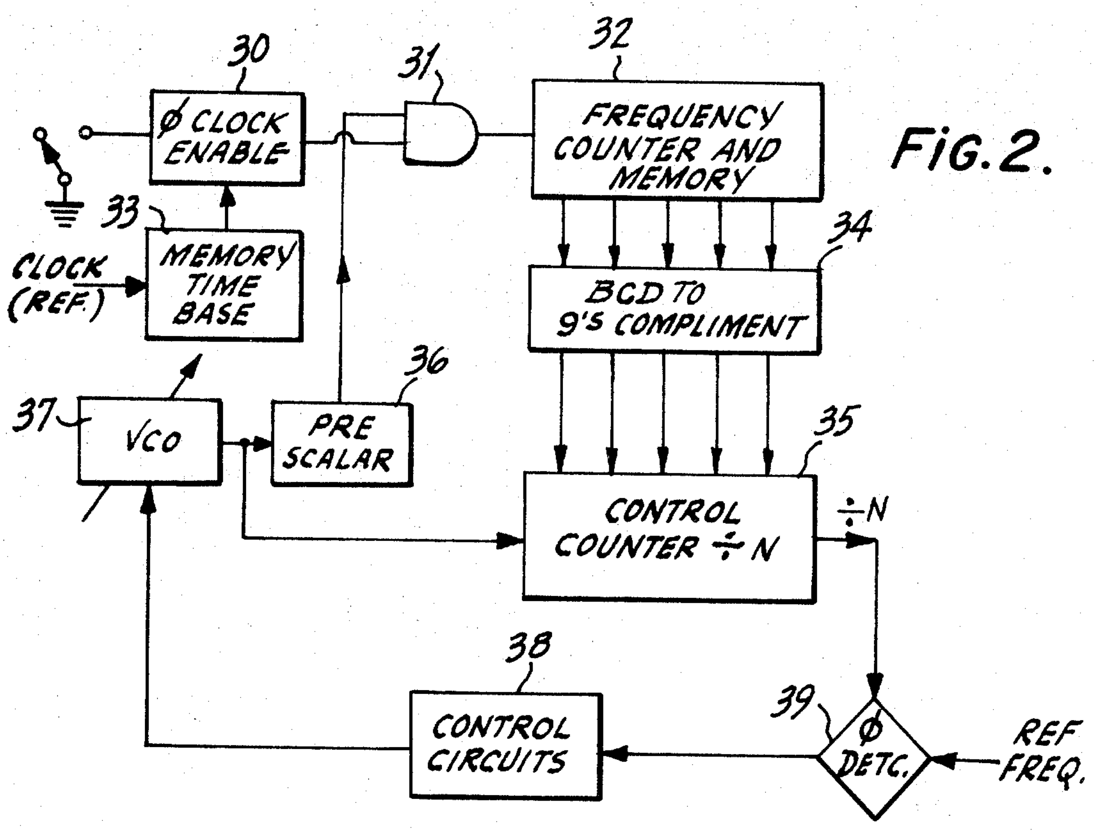
FIG. 2 is a block diagram of the phase locked loop utilized in a signal generator according to this invention.

FIG. 2 shows a block diagram in more detail of the divide by N module 19 shown in FIG. 1. There is shown a switch 40 which basically is operative to enable the phase locked loop when desired. If switch 40 is in the position shown, the phase locked loop is inoperative. When switch 40 is thrown into the dash line position, it enables the phase locked enable module 30. As will be seen, the function of the phase lock enable module 30 is to control the frequency counter and memory 32 and to supply clock pulses via the AND gate 31. These clock pulses are derived from a reference source and are further processed by the memory time base module 33 which divides the clock pulses by a given integer. In order to understand the operation of the entire module let us assume that the phase locked loop is enabled by switch 40 being in the on position. The output of the voltage control oscillator (VCO) 37 is applied to a prescaler module 36. The function of the prescaler 36 is to divide the oscillator frequency by a given integer. The divided output from prescaler 36 is applied to one input of gate 31. The other input of gate 31 is derived from the phase locked enable module 30 and is obtained via the memory time base module 33. The purpose of the input from the phase locked enable circuit 30 is to permit a predetermined number of pulses from the prescaler 36 representative of the oscillator frequency to enter the frequency counter and memory. The frequency counter and memory 32 then stores a predetermined number of pulses during the appropriate cycle of the memory time base wave form. The stored number is of course representative of the frequency of the oscillator 37. The frequency counter and memory module 32 therefore counts the prescaled oscillator frequency over the interval determined by the memory time base signal. The counter retains that count as long as the phase locked loop is enabled via switch 40. The numbers stored in the frequency counter and memory 32 are used to program the phase locked loop. Each counter stage in the frequency counter 32 contains a binary coded decimal (BCD) number. For example, in a 5 stage counter each counter stage would contain a digit indicative of tens of thousands, thousands, hundreds, tens and integers. The outputs of these BCD stages are coupled to a BCD to nines compliment converter 34. In this arrangement each BCD number as converted into its 9 compliments via module 34 and is used to program the control counter 35 which in essence varies its division integer N according to the number stored in the frequency counter and memory module 32. This therefore determines that the control counter 35 is automatically programmed such that the oscillator frequency as applied thereto directly from the VCO 37 is always divided down to a frequency approximately corresponding to the reference frequency. The reference frequency for example which may be 100KHz and derived from a calibrated crystal oscillator is applied to one input of the phase detector 39 while the output of the programmed control counter 35 is applied to the other input. Phase detector 39 compares the output from the control counter 35 with the reference signal and provides an error voltage if they are not at the same frequency or phase. This error voltage is processed by the control circuits 38 and applied to the variable reactance input of oscillator 37 to control the frequency thereof. The output from the control counter 35 is made to equal the frequency of the reference signal which therefore ascertains that the oscillator 37 is operating at an integral multiple of the reference frequency. The concept of using a frequency counter and memory 32 to control a control counter 35 by means of setting the control counter by a nines compliment is known in the art, and reference can be made to the following pulications for a detailed description of the operation of such circuits. See an article entitled "Pulse Swallowing" published in EDN on Oct. 1, 1967 by John Nicholas and Charles Shinn. Basically, the technique is important in high speed operation that is in operating with high VCO frequencies. The prescaler is utilized to minimize the inclusion of costly high speed logic. For further examples of such techniques of using programmable dividers reference is made to an article entitled "Programmable Divider Performs at 140MHz" appearing in Computer Hardware published on Apr. 15, 1971. In any event as indicated above and as will be shown in greater detail in FIG. 3, the outputs of the various modules as the frequency counter 32, the control counter 35, the prescaler 36 and so on are digital wave-shapes and therefore are characterized by sharp, negative and positive transitions. In this manner the phase detector 39 and the control circuit 38 function to convert phase or frequency errors contained in these digital wave shapes into a dual polarity DC voltage which can be used to control the variable reactance device associated with the VCO 37.

Figure 3A:
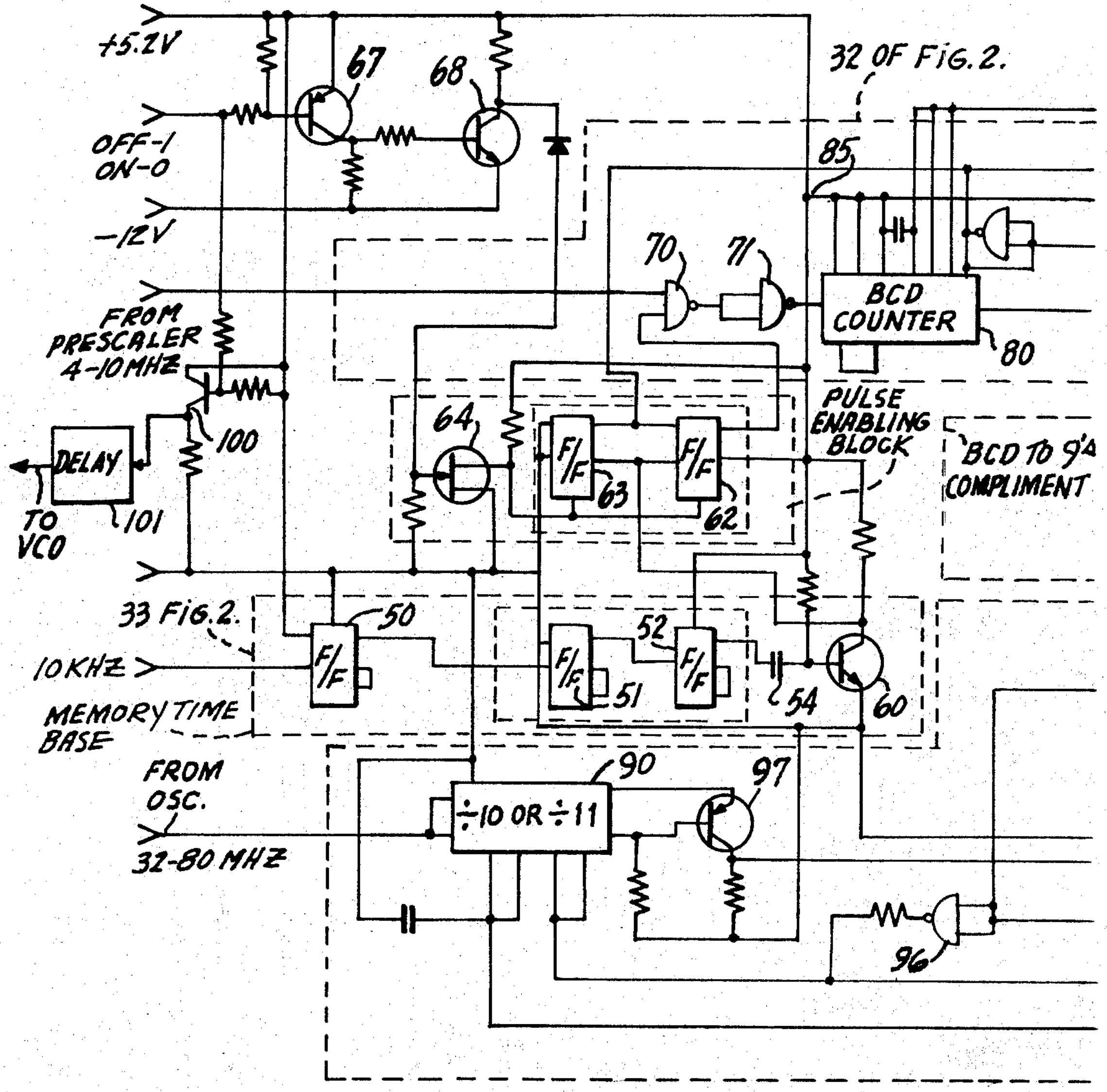
FIGS. 3*a* and 3*b* are detailed block diagrams partially in schematic form of a portion of the phase locked loop including a programmable divider according to this invention.
Figure 3A:
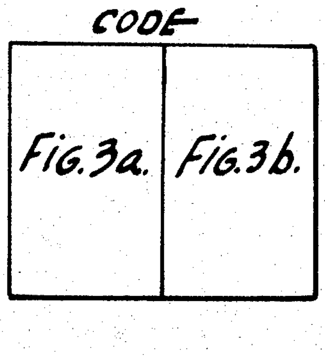
Figure 3B:
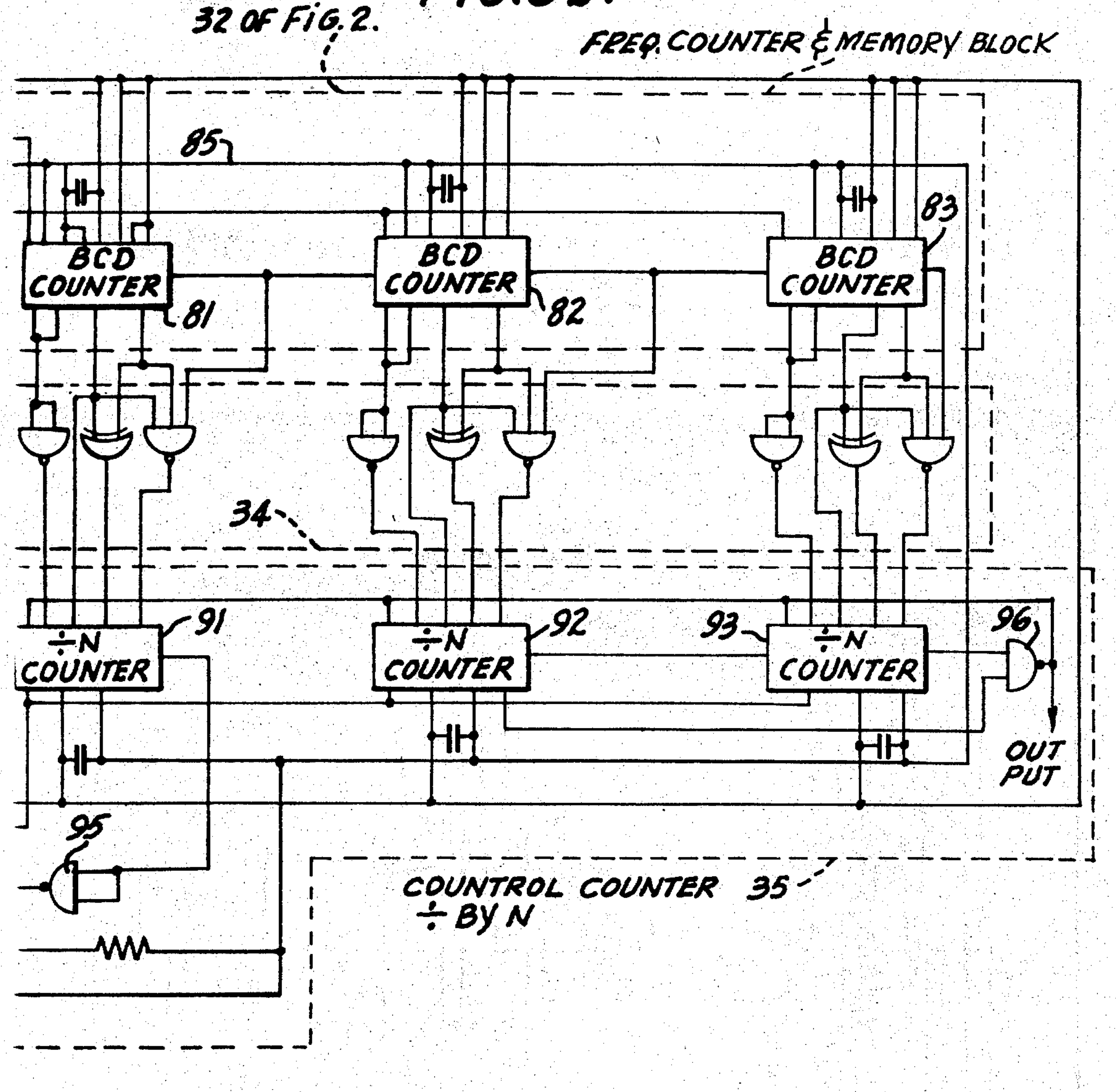

Referring to FIGS. 3*a* and 3*b*, there is shown a detailed schematic diagram of the frequency counter and memory 32, the BCD converter 34, the control counter 35, the phase lock enable module 30 and memory time base 33 of FIG. 2.

MEMORY TIME BASE MODULE 33

The memory time base module receives a 10KHz square wave from the clock reference source dividers. The square wave is divided in frequency by a factor of eight, accomplished by the cascaded counter configuration formed by flip-flops (F/F) or binary multivibrators 50, 51 and 52. The division thus provides a 1.25KHz square wave at the output of flip-flop 52. This square wave is applied to the base electrode of NPN transistor, via an AC coupling path provided by capacitor 54.

The collector electrode of transistor 60 thus provides the 1.25KHz square wave which is applied to the phase locked enabling module 30 (FIG. 2).

PHASE LOCK ENABLING BLOCK 30

The purpose of the phase lock module 30 is to enable the frequency counter and memory module 32 for predetermined controlled cycles of 800 microseconds (time duration provided by 1.25KHz clock).

The phase enabling block contains two flip-flops 62 and 63 arranged in a delay configuration and having applied to their inputs the 1.25KHz clock signal from the memory time base circuit 33.

A field effect transistor 64 is shown having its source electrode coupled to the preset inputs or DC set inputs of flip-flops 62 and 63.

When the field effect transistor is saturated, the source electrode is at ground thus inhibiting flip-flop operation. The gate electrode of the field effect transistor 64 is biased by means of transistors 67 and 68 arranged in a complimentary switch configuration. When a positive voltage is applied to the base electrode of transistor 64 the voltage at the collector goes towards −V or −12 volts, this cut-off's transistor 68 causing its collector voltage to go towards +5.2 volts, thus forward biasing transistor 64 and therefore inhibiting the phase enabling block. When the voltage at the base of transistor 67 is at ground the collector electrode of transistor 67 goes towards the +5.2 volt level. This saturates transistor 68, whose collector voltage goes towards the −12 volt supply. This reverse biases FET 64 thus enabling flip-flops 62 and 63. The reverse biasing of the FET removes the inhibit from the flip-flops. The first clock pulse from the memory time base module 33 following the enabling of the loop, afforded by grounding the base of transistor 67, triggers flip-flop 62. This causes the output lead to reverse states and remain in that state until the phase enabling block is again disabled. The second clock pulse following the enabling of the loop triggers F/F 63 and causes it to reverse state and remain in that state until the loop is disabled. Therefore, there is an 800 microsecond delay (one clock pulse at 1.25KHz) between the triggering of flip-flops 62 and 63. This delay is used to load the frequency counter and memory module block 32.

FREQUENCY COUNTER AND MEMORY MODULE BLOCK 32

This block functions to count the pre-scaled oscillator frequency over one 800 microsecond period and retain that count as long as the phase locked loop is enabled.

Normally when the loop is disabled the two gates 70 and 71 driving the first counter module 80 are enabled via the connection of the input of gate 70 to flip-flop 63. The frequency counting modules 81, 82 and 83 are disabled and hence the counters do not accumulate a count. Each counter module 81, 82 and 83 are BCD counters and are available as integrated circuit chips. The counters 81, 82 and 83 are disabled via the connection of the output of flip-flop 62 to the inhibit input of counters 81, 82 and 83 via line 85.

As soon as FET 64 is turned off corresponding to the enabling of the loop, the line 85 is activated via flip-flop 62 during the first clock cycle from memory time base. This causes the counters 81, 82 and 83 to accumulate the prescaled count corresponding to the oscillator (VCO) frequency. As indicated, 800 microseconds later or during the next pulse flip-flop 63 reverses state, thus disabling the prescaled pulses via gate 70. This ascertains that the counters have stored therein the number representative of the oscillator frequency and will not receive any additional pulses during the phase lock mode.

The numbers stored in BCD counters 81, 82 and 83 are used to program or preset the divider with the nine's compliment of the BCD number corresponding to hundreds, tens and units respectively. The last digit as will be shown is ignored.

It is noted that each time the phase lock loop is disabled, the counters are reset and inhibited until the loop is again enabled at which time a new number will be stored. The enabling and disabling of the loop can be achieved by a manual operation or automatically when the generator is being tuned. For example, the loop can automatically be inhibited when tuning of the VCO occurs and automatically enabled when one stops the tuning process, if desired.

BCD TO 9'S COMPLIMENT CONVERTOR 34

Coupled to the output of each BCD stage are three gates which serve to convert the BCD number stored into the nine's compliment. The conversion from BCD to nine's compliment is known in the art and is performed by AND/OR gate arrangements. As shown in the figure each stored number is complimented separately and used to program the divide by N counter or control counter 35.

CONTROL COUNTER ÷ N, 36

This counter comprises a series of cascaded counters 90, 91, 92 and 93.

Counter 90 is under control of counter 91 via gates 95 and 96. The counter 90, as explained, in the above referenced articles, will perform a division by ten or eleven depending upon the setting of counter 91.

The divided oscillator signal output from counter 90 is applied to the base electrode of a driver transistor 95, whose collector drives counters 91 to 93.

The counters 91 to 93 are preset by the nines compliment convertor 35 in a manner so that the output via gate 96 is always about 100KHz equal to the reference frequency to permit the phase detector to provide the error voltage control.

EXAMPLE OF OPERATION

For this example assume that the oscillator (VCO) 37 (FIG. 2) is capable of being tuned over the range of 32 to 80MHz. Let us assume that one desires to lock the oscillator 37 at 40MHz by comparing the divided frequency with the crystal desired reference frequency.

Accordingly, the input from the prescaler (36 of FIG. 2) divides the oscillator signal by 8 and this signal (5MHz) is applied to gates 70 and 71 driving the frequency counter and memory block 32.

When the loop is enabled, the counters will count 40,000 pulses during the 800 microsecond period and will therefore store the number 400. The nines compliment of 400 is 599.

This number 599 is preset into counters 91, 92 and 93, to cause them to divide the 40MHz signal by 400. It is of course noted that the first stage 90 already provided a division by 10. Therefore, the 40MHz signal is divided totally by 400 to provide an output at gate 96 a signal at a frequency of 100KHz. It is of course noted that if the oscillator (VCO) were not exactly at 40MHz then the output of gate 96 would not be exactly at 100KHz, thus the difference would be detected by the phase detector and the oscillator thusly controlled so that the output via gate 96 is at the frequency of 100KHz.

LOOP DELAY CIRCUIT — TRANSISTOR 100 AND DELAY 101

Also shown in FIG. 3a is a transistor 100 (PNP) having its base electrode coupled to the base electrode of transistor 67, for receiving the phase lock loop enabling signal. The output collector electrode of transistor 100 is coupled to a delay module 101, which may be an RC network or a monostable multivibrator or other delay module.

The function of this circuit is to prevent the oscillator frequency from changing when the phase locked loop is first enabled. As indicated, voltage control of the oscillator is afforded by varying the voltage or current level on a varactor diode or other variable reactance device.

When one enables the loop, the voltage on the varactor should be maintained until the frequency counter and memory block 32 has time to store the prescaled frequency. If this were not done, the phase detector might develop an erroneous transient error signal and thus offset the oscillator.

Accordingly, transistor 100 and delay 101 serve to inhibit oscillator variation until the memory counter is loaded at the start of the enabling of the phase locked loop.

Figure 4:
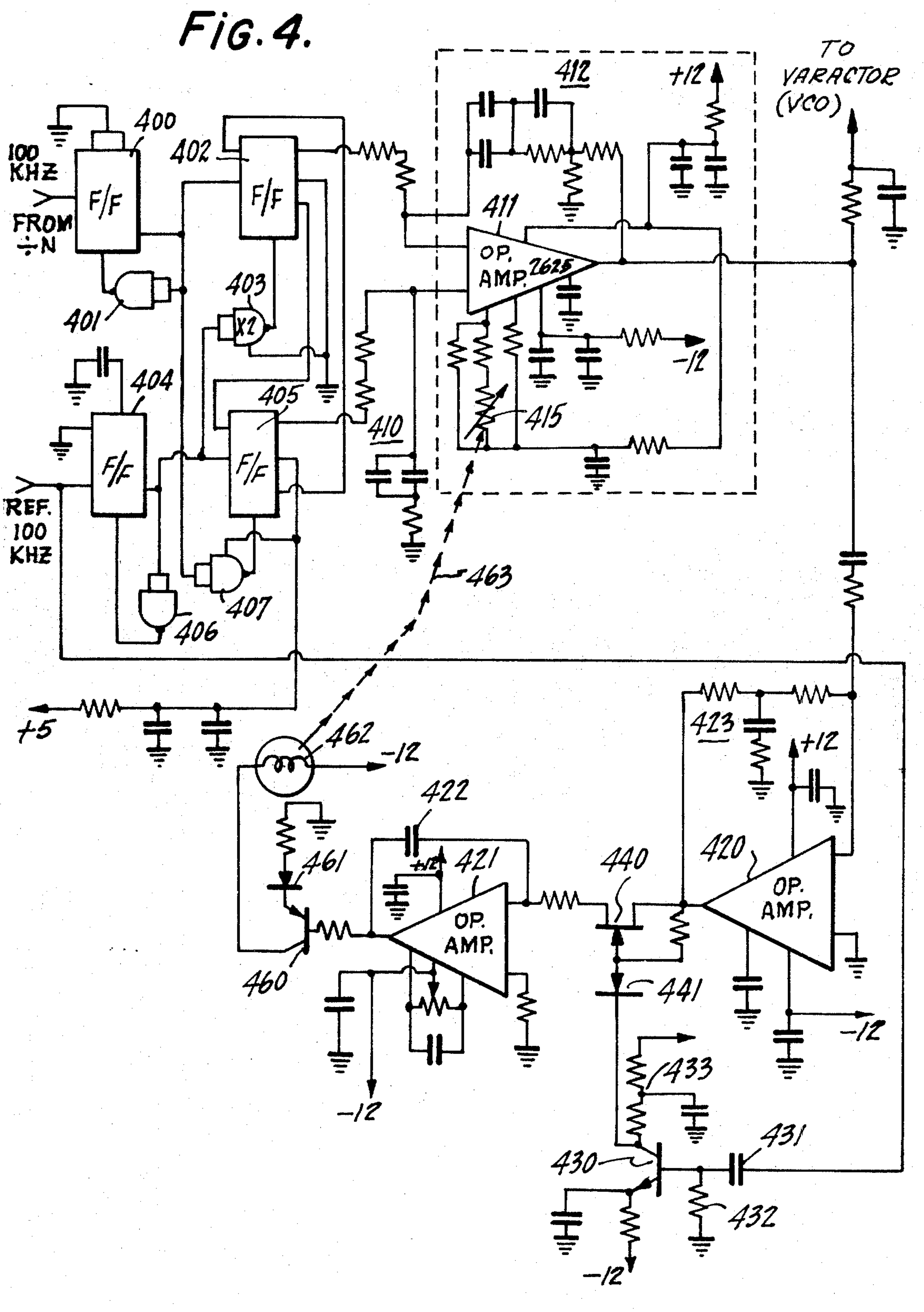
FIG. 4 is a circuit schematic diagram of a phase detector and control circuit according to this invention.

Referring to FIG. 4, there is shown the phase detector module and the control circuits corresponding to reference numerals 39 and 38, respectively, of FIG. 2.

PHASE DETECTOR

The function of the phase detector, as indicated, is to convert a phase or frequency error between the derived 100KHz signal and the reference signal into a DC control voltage for application thereto to a varactor diode associated with the VCO.

The 100KHz signal from the control counter ÷ N via gate 96 is applied to the input of flip-flop 400, which acts as a differentiator. The module 400 provides a 40 nanosecond pulse which pulse is coincident with the leading edge of the 100KHz signal from the control counter. The pulse has a narrow width and a 100KHz repetition rate. Since gate 401 resets the flip-flop for each transition, the effective width of the pulse (40 nanoseconds) is determined by the propogation delay via gate 401 plus the triggering delay of the flip-flop 400.

Similarly, flip-flop 404 differentiates the reference clock signal (100KHz) via the same configuration utilizing gate 406 as the reset. The effective pulse width via flip-flop 404 is also about 40 nanoseconds, with this pulse in coincidence with the leading edge of the reference signal derived from the crystal controlled oscillator.

The flip-flops 402 and 403 form a digital phase detecting circuit.

The inputs to flip-flop 402 are supplied from flip-flop 400 at the trigger input thereof and via flip-flop 404 through the gate labelled X2. This gate has its input coupled to the output of flip-flop 404 and is connected to the reset lead of flip-flop 402. Similarly, flip-flop 405 has its trigger input directly controlled by flip-flop 404 (ref. signal) while the reset input of flip-flop 405 is controlled via gate 407 connected to the output of flip-flop 400 (100KHz from the ÷ by N.

The outputs of flip-flops 402 and 405 are coupled respectively via resistive networks to the inverting and non-inverting input of the operational amplifier 411.

Operation is as follows. If the differentiated 40 nanosecond pulses are in coincidence, then the flip-flops 402 and 405 will not change state, as they are being triggered and reset at the same time. Now assume that the reference signal pulse from 404 leads the ÷ N pulse from 400. If this occurs, flip-flop 402 will provide at an output a pulse waveshape at the 100KHz reference frequency, wherein the pulse width is proportional to the amount of delay between the 100KHz pulses. For example, if the lead is 90°, the pulse width will be 2.5 microseconds. If the lead is 270°, the pulse width will be 7.5 microseconds. For a 360° lead, the output of flip-flop 402 will be a constant positive value.

This occurs because the flip-flop 402 is reset by gate X2 and then set by flip-flop 400. Similarly, if the reference frequency is higher than the ÷ N frequency, the output of flip-flop 402 provides an output waveshape whose duty factor changes at a rate equal to the difference in frequency.

In the above cases, there is no output from flip-flop 405 as the lagging ÷ N signal keeps the flip-flop 405 reset.

However, as can be seen, if the reference frequency lags, the ÷ N signal or is lower in frequency, then flip-flop 405 provides an output and flip-flop 402 during these modes does not. The flip-flops 402 and 405 can be type D flip-flop configurations and will operate accordingly.

The operational amplifier 411 has a feedback network 412 enabling it to operate as an integrator. The function of the OP. AMP. 411 is to provide a DC error voltage of correct polarity from the waveshapes provided at the outputs of flip-flops 402 and 405. In this manner since flip-flop 402 provides an error signal when the frequency of the reference is higher than the frequency from the ÷ N, this waveform is applied to the inverting input of OP. AMP. 411, to produce a negative DC at the output of the amplifier 411. This negative voltage serves to further reverse bias the varactor diode associated with the VCO. Reverse biasing decreases the capacitance of the varactor and therefore raises the frequency of the VCO to thereby bring the same into lock with the reference.

On the other hand, the output of flip-flop 405 is applied to the non-inverting input of OP. AMP. 411. The error waveform will cause a positive voltage to appear at the output of OP. AMP. 411, to thereby increase the capacitance of the varactor and lower the frequency of the VCO. When phase lock is achieved by the coincidence of the pulses from flip-flops 400 and 404, the output of the OP. AMP. 411 will be a constant DC voltage thus maintaining the VCO at the desired frequency.

Therefore, when the oscillator is locked to the reference there should be no error signal at the phase detector output evidenced by the output of OP. AMP. 411.

Unfortunately, no manufacturer has yet produced an ideal operational amplifier, which could perform as indicated above. The most significant limitation affecting accuracy in such amplifiers is offset and it varies with temperature, time, supply voltage and common mode voltage. The offset therefore causes a DC or AC component to appear at the output of the OP. AMP. 411 even though there is no input signal. In order for the loop to lock accurately the offset error of the OP. AMP. 411 has to be cancelled.

In this circuit during lock, there will be a 100KHz signal at the output of the OP. AMP. 411 due to the unbalance created by the offset of the amplifier.

This offset could be compensated for by manually nulling the amplifier by means of the trimmer potentiometer connected to the OP. AMP. 411. However, due to the very high open loop gains of such amplifiers the setting of this potentiometer would only serve over a very limited temperature range or supply voltage range.

This problem is automatically eliminated as follows. Another high gain operational amplifier 420 has its input connected to the output of amplifier 411. This amplifier 420 amplifies any AC ripple at the output of amplifier 411 by say 40 decibels. The output of amplifier 420 is coupled to the input of a field effect transistor 440, whose gate electrode is switched on and off according to the reference clock signal supplied to the base electrode of transistor 430. The collector load 433 of transistor 430 is applied via diode 441 to the gate to thus form a synchronous detector configuration.

Due to the operation of the phase locked loop, it is seen and can be shown that when the oscillator is locked and the ÷ N signal is therefore synchronized to the reference signal, any ripple at the output of amplifier 411 is in phase with or 180° out of phase with the reference signal. The phase being a function of the offset condition of amplifier 411. The synchronous detector as controlled by the reference clock (100KHz) will therefore indicate both the magnitude and phase of the amplified ripple voltage. The output amplifier 421 is arranged in an integrator configuration due to feedback capacitor 422 and provides a DC error voltage at its output. This error voltage is applied to the base of transistor 460 having a LED and photo-resistor 462 as a collector load. Therefore, the light output of the light emitting diode 462 is proportional to the DC error voltage. The LED device 462 varies the resistance of a photo-resistor 414 located at the compensating input of the OP. AMP. This serves to null the amplifier by changing the bias or gain thereof. Since the circuit automatically nulls the error, the cause of the same can be due to any factor as temperature, line variation, power supply changes and so on and the circuit will still perform to automatically compensate for the offset of OP. AMP. 411.

This operation leads to a solidly locked loop without 100KHz sidebands which would otherwise be present because of the DC offset.

While a specific embodiment of the invention has been disclosed, variations may be made in the frequencies employed or in the circuit elements and arrangements used without departing from the invention as disclosed.

What is claimed is

1. A signal generator of the type employing a voltage controlled oscillator, whose frequency is compared and stabilized by means of a phase locked loop including a programmable divider network for developing another frequency indicative of said oscillator frequency and comparing it with an accurate reference frequency, in combination therewith phase detecting apparatus for providing an error voltage when said other frequency is not in synchronism with said reference frequency, comprising:

a. first means responsive to said another frequency for converting the same to a first pulse series having the repetition rate of said another frequency and a narrow pulse width, b. second means responsive to said accurate reference frequency for converting the same to a second pulse series having the repetition rate of said reference frequency and said narrow pulse width, c. first and second bistable circuits each having at least two trigger inputs and an output, said bistable circuits capable of being in any one of two stable states under control of a suitable signal applied to any one of said trigger inputs, one of said inputs of said first bistable coupled to said first means, and said corresponding input of said second bistable coupled to said second means, said other input of said first bistable coupled to said second means while said corresponding input of said second bistable coupled to said first means, to cause said first bistable to provide a first error signal at its output when said another frequency is lower than said reference, and to cause said second bistable to provide a second error signal when said another frequency is higher than said reference frequency, d. an operational amplifier of the type which undesireably provides an offset error signal, said operational amplifier having a first non-inverting input and a second inverting input and arranged as an integrator, said operational amplifier biased to provide a first polarity DC signal for said first error signal applied to said non-inverting input and a second opposite polarity DC signal for said second error signal applied to said inverting input, said offset error signal undesireably appearing at the output of said operational amplifier even when said another frequency and said reference signal are equal, e. means coupled to the output of said operational amplifier and responsive to said offset error signal for providing another DC signal indicative of the magnitude and polarity of said offset error signal, and f. control means coupled to said operational amplifier and responsive to said another DC signal for varying the characteristic of said amplifier in a direction to cancel said offset signal.

2. The signal generator according to claim 1 wherein said control means coupled to said operational amplifier comprises:

a. a source of light responsive to said another DC signal for providing a variable intensity light signal according to the magnitude of said DC signal, and b. a photo-resistor optically coupled to said source of light and coupled to said operational amplifier to alter the operating characteristics thereof according to said intensity to thereby eliminate said offset error signal.

3. A phase locked loop of the type including a phase detector for developing an error voltage when the frequency of an oscillator to be controlled deviates from the frequency of a reference signal, said phase detector error signal being applied to an operational amplifier arranged in an integrating configuration for developing a DC voltage used to control the frequency of said oscillator in a direction such that it is made to substantially equal said frequency of said reference signal, said operational amplifier of the type that undesirably provides an offset error signal when said oscillator and said reference signal are substantially equal, said offset error signal characterized by having a repetition rate according to said reference frequency, in combination therewith apparatus for eliminating said offset error signal comprising, a. a synchronous detector responsive to said reference signal and said offset error signal to provide at an output a DC control signal indicative of the magnitude and phase of said offset signal,
b. means coupling said output of said synchronous detector to said operational amplifier to cause said amplifier to respond to said DC control signal in a direction to eliminate said offset error signal.

4. The apparatus according to claim 3 wherein said means coupling said output of said synchronous detector to said operational amplifier comprises, a. a source of light coupled to said output of said synchronous detector and driven thereby to emit a variable intensity of light according to the magnitude of said offset error signal, and
b. a photo resistor optically coupled to said source of light and coupled to said operational amplifier to alter the operating characteristics thereof according to said intensity to thereby eliminate said offset error signal.

5. A signal generator of the type employing a voltage controlled oscillator, whose frequency is compared and stabilized by means of a phase locked loop including a programmable divider network for developing another frequency indicative of said oscillator frequency and comparing it with an accurate reference frequency, in combination therewith phase detecting apparatus for providing an error voltage when said other frequency is not in synchronism with said reference frequency, comprising:

a. first and second bistable multivibrators, each having at least a first and a second input terminal, each of said terminals responsive to a trigger signal to change the state of said bistable multivibrator at said output terminal,
b. means coupling said programmable divider to said first input terminal of said first multivibrator and to said second input terminal of said second multivibrator,
c. means for applying said reference frequency to said second input terminal of said first multivibrator and to said first input terminal of said second multivibrator, to cause one of said multivibrators to change state when said another frequency is higher than said reference and said other to change state when said reference frequency is higher than said another frequency,
d. amplifying means having a first inverting and a second non-inverting input terminal and an output terminal, said first input terminal coupled to said first multivibrator, said second input terminal coupled to said second multivibrator, to provide at an output of said amplifying means said error voltage capable of controlling said oscillator so that said other frequency is in synchronism with said reference frequency, said amplifying means further operative to provide a spurious error signal unrelated to any frequency difference between said other frequency and said reference frequency, said spurious error signal undesireably operative to offset the frequency of said oscillator,
e. means coupled to said output terminal of said amplifying means and responsive to said reference frequency to provide at an output a control signal determinative of the magnitude and phase of said spurious error signal, and
f. means coupled to said amplifying means and responsive to said control signal to vary the characteristics of said amplifying means in a direction to cancel said spurious error signal.

6. Apparatus using a phase detector for providing at outputs a first and second DC error signal by comparing the phase of a reference signal with a signal from a source to be controlled, said phase detector employing an operational amplifier having an inverting and non-inverting input for combining first and second error signals from said detector, to provide a single dual polarity signal therefrom, said operational amplifier undesirably having an input offset error which causes a given AC error signal to appear at the output thereof when the frequencies of said signal from said controlled source and said reference signal are substantially equal, in combination therewith apparatus for eliminating said given AC error signal comprising, a. detecting means operative in response to said reference signal and responsive to said AC error signal for providing at an output a DC signal determinative of the magnitude and phase of said AC error signal,
b. means coupling said output of said detector to said operational amplifier to cause said amplifier to vary its characteristics according to said DC signal in a direction to cancel said AC error signal.

7. In combination:

a. a variable oscillator capable of being tuned over a relatively large band of frequencies, said oscillator having a frequency control input adapted to receive a DC control voltage for varying the frequency thereof according to the polarity and magnitude of said DC control voltage,
b. a first frequency counter coupled to said oscillator and operative to store a count therein representative of the frequency of said oscillator,
c. a second programmable counter having a plurality of inputs for presetting said programmable counter to cause said counter to divide an input signal applied to an input terminal thereof by a predetermined integer, such that the output signal of said counter is relatively at a predetermined desired frequency,
d. means coupling said first counter to said plurality of inputs of said programmable counter to preset said counter according to said stored count,
e. means coupling said programmable divider to said variable oscillator to cause said counter to divide said oscillator frequency according to said preset stored count to cause said programmable counter to provide said predetermined desired frequency independent of the setting of said oscillator,
f. a reference signal source for providing a reference frequency substantially at said predetermined desired frequency,
g. phase detecting means for comparing said reference signal with said output signal of said programmable divider to provide at an output an error signal indicative of any frequency difference therebetween, h. means responsive to said error signal, said means including a high gain operational amplifier which amplifier undesireably provides a spurious error signal, which signal has a DC component unrelated to any difference between said output signal of said programmable divider and said reference signal, said means having an output coupled to said frequency control input of said oscillator to cause said oscillator to provide a frequency dependent upon both said error signal and said spurious signal, i. detector means coupled to said high gain amplifier and responsive to said spurious error signal and said reference signal to provide a compensating signal at an output thereof indicative of the magnitude and phase of said spurious error signal, and j. means for applying said compensating signal to said means responsive to said error signal to substantially cancel the same to cause said oscillator to provide a frequency which when applied to said divider causes the same to provide said output signal at a frequency substantially equal to said frequency of said reference signal.

8. The combination according to claim 7 further comprising, a. switching means capable of being operated in a first and second state, said switching means being coupled to said first counter and to said variable oscillator, to permit said counter to accummulate said count representative of said oscillator frequency in said first state, while preventing said oscillator from varying its frequency until said count is accummulated and for preventing said first counter from accummulating said count in said second state.

* * * * *